(12) United States Patent
Andry et al.

(10) Patent No.: US 9,412,663 B1
(45) Date of Patent: Aug. 9, 2016

(54) DIES FOR RFID DEVICES AND SENSOR APPLICATIONS

(71) Applicant: International Business Machines Corporation, Armonk, NY (US)

(72) Inventors: Paul S. Andry, Yorktown Heights, NY (US); Robert L. Wisnieff, Ridgefield, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/935,403

(22) Filed: Nov. 7, 2015

Related U.S. Application Data

(63) Continuation of application No. 14/658,151, filed on Mar. 14, 2015.

(51) Int. Cl.
*H01L 21/00* (2006.01)
*H01L 21/78* (2006.01)
*H01L 21/3065* (2006.01)
*H01L 21/308* (2006.01)
*H01L 21/304* (2006.01)

(52) U.S. Cl.
CPC .............. *H01L 21/78* (2013.01); *H01L 21/304* (2013.01); *H01L 21/308* (2013.01); *H01L 21/3065* (2013.01)

(58) Field of Classification Search
CPC ......... H05K 1/189; H01K 24/11; G09F 3/208
USPC .................. 438/106, 107, 110, 113
See application file for complete search history.

(56) References Cited

U.S. PATENT DOCUMENTS

| | | | |
|---|---|---|---|
| 6,100,804 A | 8/2000 | Brady | |
| 7,498,802 B2 | 3/2009 | Takahata | |
| 8,067,253 B2 | 11/2011 | Ferguson | |
| 8,153,464 B2 | 4/2012 | Montgomery | |
| 8,531,299 B2 | 9/2013 | Forster | |
| 2006/0227669 A1* | 10/2006 | Pennaz | G04F 13/04 368/327 |
| 2009/0160653 A1 | 6/2009 | Yeh et al. | |

(Continued)

FOREIGN PATENT DOCUMENTS

CN 102880900 1/2013

OTHER PUBLICATIONS

Paul S. Andry et al. Unpublished U.S. Appl. No. 14/658,151, filed Mar. 14, 2015, Dies for RFID Devices and Sensor Applications, pp. 1-25 plus 6 sheets drawings.

(Continued)

*Primary Examiner* — S. V. Clark
(74) *Attorney, Agent, or Firm* — Louis J. Percello; Otterstedt, Ellenbogen & Kammer, LLP

(57) ABSTRACT

Deep reactive ion silicon etching of a device wafer, laser-induced release of individual dies, and individual placement of the dies on flexible substrates facilitate formation of circuits having relatively large external inductors for powering devices such as RFID devices. Small flexible tabs enable die-inductor connection. The absorption properties of both an adhesive layer and an ablation layer may be employed to facilitate debonding of individual dies from a glass handler without damaging integrated circuits associated with the dies. Die packs including cavities for accepting individual dies facilitate fabrication processes using dies having small dimensions.

16 Claims, 6 Drawing Sheets

(56) References Cited

U.S. PATENT DOCUMENTS

| | | | |
|---|---|---|---|
| 2009/0294542 A1* | 12/2009 | Rogy | G06K 19/0775 235/492 |
| 2009/0309736 A1 | 12/2009 | Heurtier | |
| 2010/0230498 A1 | 9/2010 | Atherton | |
| 2012/0055013 A1 | 3/2012 | Finn | |
| 2012/0175422 A1 | 7/2012 | Zambon | |
| 2012/0322236 A1 | 12/2012 | Lei | |
| 2012/0322237 A1 | 12/2012 | Lei | |
| 2012/0322238 A1 | 12/2012 | Lei | |
| 2013/0017668 A1 | 1/2013 | Lei | |
| 2014/0291405 A1 | 10/2014 | Harkes | |
| 2015/0129666 A1* | 5/2015 | Butler | H04L 67/1097 235/492 |
| 2015/0324681 A1* | 11/2015 | Mats | G06K 19/07754 235/492 |

OTHER PUBLICATIONS

List of IBM Patents or Applications Treated as Related.

* cited by examiner

DIES FOR RFID DEVICES AND SENSOR APPLICATIONS

CROSS-REFERENCE TO RELATED APPLICATION

This application is a continuation of U.S. patent application Ser. No. 14/658,151 filed Mar. 14, 2015, the complete disclosure of which is expressly incorporated herein by reference in its entirety for all purposes.

FIELD

The present disclosure relates to semiconductor device fabrication and RFID and sensor devices obtained thereby.

BACKGROUND

Semiconductor device fabrication includes the preparation of a wafer for integrated circuit packaging. A wafer can, for example, be mounted to a polymeric substrate having an adhesive film thereon. Once mounted, individual dies can be obtained from a wafer including a large number of integrated circuits using a singulation process. The individual dies remain in place on the substrate.

RFID (radio frequency identification) devices are employed for identification and tracking purposes through the use of electromagnetic fields. Tags including such devices may be powered by electromagnetic induction. RFID tags including electrically insulating, flexible substrates including antennas electrically coupled to integrated circuit chips have been disclosed. Radio frequency identification, or RFID, uses radio waves to automatically identify people or objects. The most common method of identification is to store a serial number that identifies a person or object, and perhaps other information, on a microchip that is attached to an antenna. The antenna enables the chip to transmit the identification information to a reader. The reader converts the radio waves reflected back from the RFID tag into digital information that can then be passed on to computers that can make use of it. Radio Frequency Identification (RFID) is becoming an important identification technology for tracking objects such as packages, merchandise, luggage and the like. RFID systems provide additional identification functions not found in more conventional identification technologies such as barcodes. Unlike a barcode, RFID tags do not necessarily need to be within line of sight of the reader, and may be embedded in the tracked object.

3D chip technologies, including both 3D ICs (integrated circuits) and 3D packaging, may utilize through-silicon vias (TSV). A TSV is a vertical interconnect access (VIA) in which a connection passes entirely through a silicon wafer or die. TSVs can allow more tightly integrated structures than edge wiring.

Temporary wafer bonding/debonding includes the act of attaching a silicon device wafer to a substrate or handling wafer so that it can be processed, for example, with wiring, pads, and joining metallurgy, while allowing the wafer to be thinned. Debonding is the act of removing a processed silicon device wafer from a substrate or handling wafer. Some existing approaches for temporary wafer bonding/debonding involve the use of an adhesive layer placed directly between a silicon device wafer and a handling wafer. When the processing of the silicon device wafer is complete, the silicon device wafer may be released from the handling wafer by various techniques such as by exposing the wafer pair to chemical solvents delivered by perforations in the handler, by mechanical peeling from an edge initiation point or by heating the adhesive so that it may loosen to the point where the silicon device wafer may be removed by sheering. The blanket release of a handler can alternatively be conducted using a scanning laser at 355 nm. Commonly assigned US20140106473, which is incorporated by reference herein, describes a method for effecting full wafer release of a handler.

SUMMARY

Principles of the present disclosure provide an exemplary fabrication method that includes obtaining a structure comprising a device wafer. The device wafer includes a device side including a plurality of integrated circuits. The structure further includes a UV-transmissive handler and a bonding layer that bonds the handler to the device wafer. The exemplary fabrication method further includes applying a resist layer to the device side of the device wafer, patterning the resist layer, and singulating the device wafer using deep reactive ion etching, thereby forming a plurality of dies separated by trenches extending completely through the device wafer. The patterned resist layer is removed. A die pack including a plurality of die cavities is provided and the singulated dies are aligned with the dies cavities. At least part of the bonding layer is subjected to UV radiation through the UV-transmissive handler. Fluence of selected energy is released in a spot within the bonding layer, the spot having dimensions corresponding to the diemnsions of the dies, thereby causing release of an individual one of the dies from the UV-transmissive handler into one of the die cavities.

A second exemplary method includes obtaining a structure including a device wafer including a device side comprising a plurality of integrated circuits, a UV-transmissive handler, and a bonding layer that bonds the UV-transmissive handler to the device wafer, the device wafer having a thickness of 200 µm or less. A resist layer is applied to the device side of the device wafer and is patterned. The method further includes singulating the device wafer using deep reactive ion etching, thereby forming a plurality of dies separated by trenches extending completely through the device wafer. The patterned resist layer is removed and a die pack including a plurality of die cavities is provided. Each of the die cavities is configured for accepting an individual one of the dies. The dies are aligned with the die cavities and at least part of the bonding layer is subjected to UV radiation through the UV-transmissive handler, thereby causing selective release of one or more of the dies from the UV-transmissive handler into one or more of the cavities within the die pack.

An exemplary RFID device includes a flexible, electrically insulating substrate having a thickness between 25-100 µm, the substrate including a main portion and an integral tab extending from the main portion. The tab is foldable with respect to the main portion of the substrate. An antenna is integral with the main portion of the substrate. An electrical contact is integral with the tab and is electrically connected to the antenna. A RFID die including an integrated circuit is mounted to the main portion of the substrate and electrically connected to the antenna. The die has a thickness of 200 µm or less and a width of 200 µm or less. The electrical contact is positioned to contact a top surface of the die when folded with respect to the main portion of the substrate.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Fabrication methods as disclosed herein can provide substantial beneficial technical effects. For example, one or more embodiments may provide one or more of the following advantages:

Facilitates production of individual dies having very small dimensions and individual placement on a substrate;

Enables production of RFID tags having small dimensions and fold tabs configured to contact the top surface of a dielet;

Precision etched die pack enables handling and picking of dielets where small dielet dimensions effectively preclude conventional processing.

These and other features and advantages will become apparent from the following detailed description of illustrative embodiments thereof, which is to be read in connection with the accompanying drawings.

DETAILED DESCRIPTION

Figure 1:
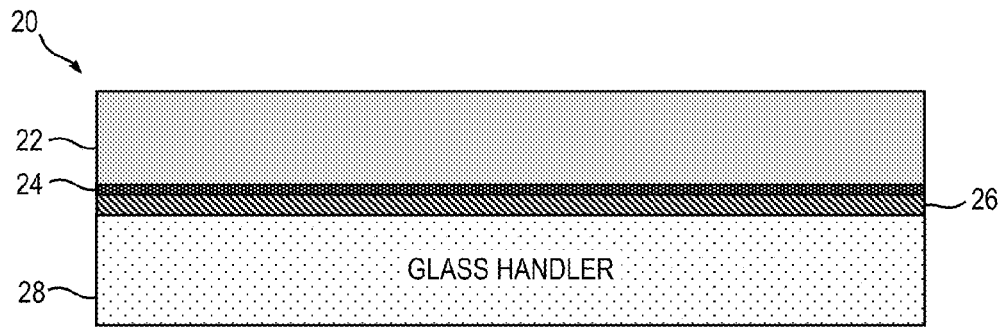
FIG. 1 is a schematic sectional illustration showing an assembly including a silicon wafer bonded to a glass handler.
Figure 2:
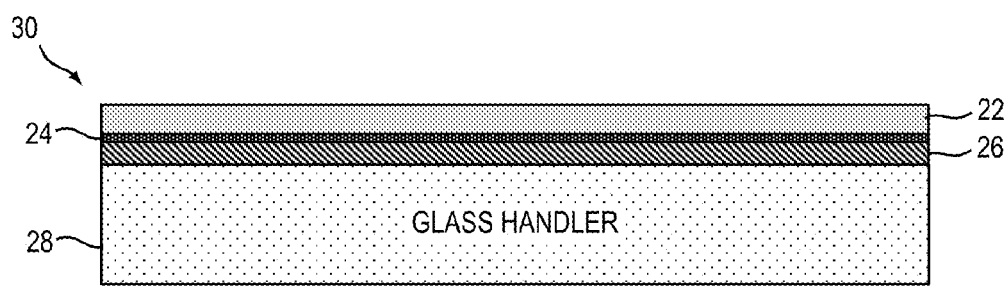
FIG. 2 is a schematic sectional illustration showing the assembly of FIG. 1 following reduction in thickness of the silicon wafer.

Exemplary embodiments of the present disclosure provide approaches for the fabrication of RFID devices using thin silicon wafers subjected to deep reactive ion etch to form individual dies that are releasable by ablating a release layer using a laser. The laser used may be an ultraviolet (UV) laser, for example, a 355 nm laser, a 351 nm laser or a 308 nm laser. The 355 nm wavelength is attractive in some embodiments due to the availability of robust and relatively inexpensive diode-pumped solid-state (DPSS) lasers.

The bonding of the silicon device wafer 22 to the handling wafer 28 includes the use of both an adhesive layer and a distinct release layer in one or more embodiments. In FIGS. 1-8, the bonding layer 26 may accordingly include both an adhesive layer and a distinct release layer. According to one approach for such bonding, the release layer may be an ultraviolet (UV) sensitive ablation layer and it may be applied to the handling wafer, which is a UV-transmissive glass handler in some exemplary embodiments. The UV ablation layer may then be cured. The bonding adhesive that forms the adhesive layer may be applied to either the glass handler or the silicon device wafer. The UV ablation layer is comprised of a material that is highly absorbing at the wavelength of the laser used in debonding. The material may also be optically transparent in the visible spectrum to allow for inspection of the adhesive bonded interface. Both the UV ablation layer and the adhesive layer are chemically and thermally stable so that they can fully withstand further processing of the resulting structure. In one or more exemplary structures, the ablation layer has a thickness between 0.1-0.5 µm. The adhesive layer has a substantially greater thickness of between 1-100 µm.

An exemplary fabrication method begins with UV ablation material being applied e.g. by spin coating onto the glass handler 28. The glass handler with UV ablation material spin-coated thereon is soft-baked to remove any solvent. Spin coating parameters may depend on the viscosity of the UV ablation layer, but may fall in the range from approximately 500 rpm to approximately 3000 rpm. The soft-bake may fall in the range from approximately 80° C. to approximately 120° C. The temperature of the final cure may fall in the range from 200° C. to 400° C. For strongly UV-absorbing or UV-sensitive materials, very thin final layers on the order of approximately 1000 Å to approximately 2000 Å thick may be sufficient to act as release layers. Some organic planarizing layers (OPLs) and organic dielectric layers (ODLs) have such properties. In other embodiments, a dye is incorporated within the polymeric material comprising the ablation layer to impart the required UV-absorbing properties. Exemplary dyes that can be employed in one or more embodiments include 9-anthracenecarboxylic acid and benzanthrone added at a weight percentage of at least ten percent to any non-absorbing material capable of forming a film from solution such as polymethylmethacrylate (PMMA). The incorporation of dyes is discussed further below with respect to the adhesive layer. Some exemplary ODL materials are spin applied to glass and cured in a nitrogen environment at 350° C. for approximately one hour to produce a film. Such a film may be optically transparent throughout the visible spectrum, but strongly sensitive to decomposition in the UV wavelength range below about 360 nm, and may be fully and cleanly ablated using common UV laser sources such as an excimer laser operating at 308 nm (e.g. XeCl) or 351 nm (e.g. XeF) or a diode-pumped tripled YAG laser operating at 355 nm.

Referring to FIG. 1, a structure 20 is obtained that includes a silicon wafer 22 bonded to a glass handler 28. The silicon wafer includes a device layer 24. The device layer includes a plurality of integrated circuits. In some embodiments, each of the integrated circuits is identical. A bonding layer 26, which may comprise multiple layers as described above, adjoins the device side of the silicon wafer and the glass handler. The thickness of the silicon wafer is reduced by grinding or other suitable process to obtain the structure 30 shown in FIG. 2. In some embodiments, the thickness of the silicon wafer is reduced to a final thickness of about fifty micrometers (50 µm) to form a silicon device wafer.

Figure 3:
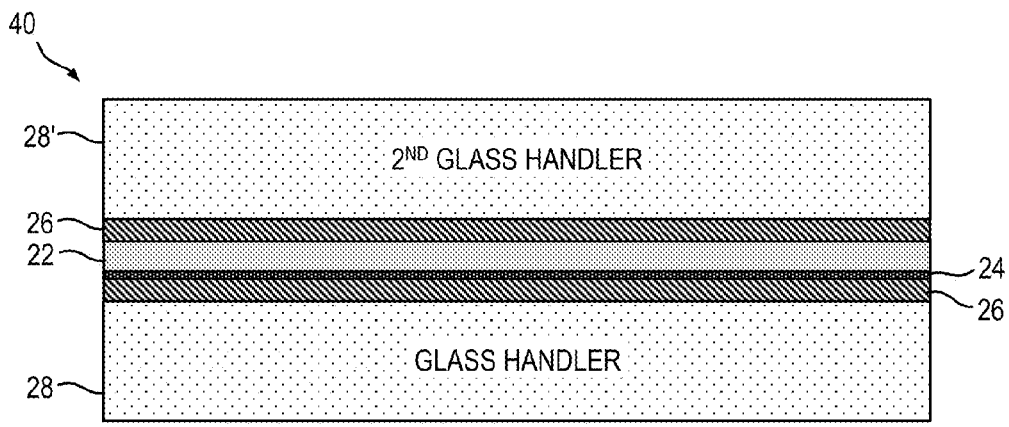
FIG. 3 is a schematic sectional illustration showing the assembly of FIG. 2 following bonding of a second glass handler to the silicon wafer.

A second glass handler 28' is bonded to the structure 30 to obtain the structure 40 shown in FIG. 3. The bonding layer 26 used to secure the second glass handler 28' to the exposed surface of the silicon wafer 22 may be a multiple layer including an adhesive layer and a UV-sensitive release layer as discussed above. The two bonding layers 26 in the structure 40 may or may not be identical in composition.

Figure 4:
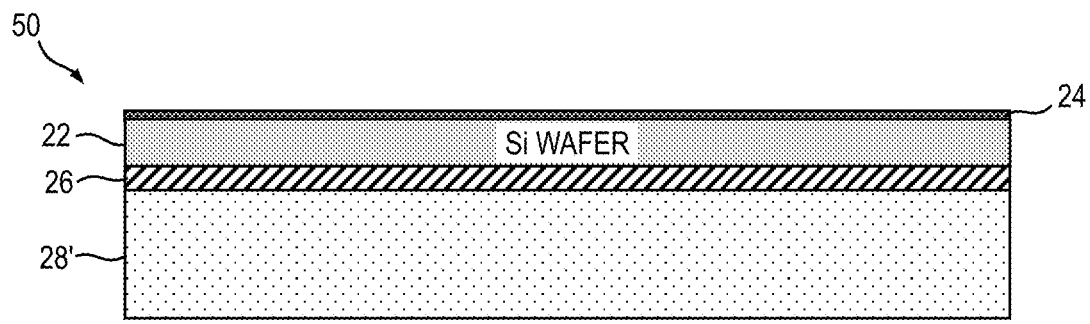
FIG. 4 is a schematic sectional illustration showing the assembly of FIG. 3 following removal of the original glass handler and cleaning of the device side of the silicon wafer.

The original glass handler 28 is removed from the structure 40 to obtain the structure 50 shown in FIG. 4. Laser debonding to release the glass handler at the ablation layer interface may be performed using any one of a number of UV laser sources including excimer lasers operating at 308 nm (e.g. XeCl) or 351 nm (e.g. XeF) as well as diode-pumped (tripled) YAG laser operating at 355 nm or diode-pumped (quadrupled) YAG laser operating at 266 nm. Excimer lasers may be more expensive, may require more maintenance/support systems (e.g. toxic gas containment) and may have generally have very large output powers at low repetition rates (e.g. hundreds of Watts output at several hundred Hz repetition). UV ablation thresholds in the materials specified here may require 100-150 milliJoules per square cm (mJ/sqcm) to effect release. Due to their large output powers, excimer lasers can supply this energy in a relatively large area beam having dimensions on the order of tens of square millimeters area (e.g. 0.5 mm times 50 mm line beam shape). Due to their large output power and relatively low repetition rate, a laser debonding tool which employs an excimer laser may include a movable x-y stage with a fixed beam. Stage movement may be on the order of ten to fifty mm per second. The wafer pair to be debonded may be placed on the stage and scanned back and forth until the entire surface had been irradiated.

An alternative laser debonding system may be created using a less expensive, more robust and lower power solid-state pumped tripled YAG laser at 355 nm by rapidly scanning a small spot beam across the wafer surface. The 355 nm wavelength laser may compare favorably to the quadrupled YAG laser at 266 nm for two reasons: 1) output powers at 355 nm are typically two to three times larger than at 266 nm for the same sized diode laser pump power, and 2) many common handler wafer glasses (for example, Schott Borofloat 33) are about ninety percent or more transmissive at 355 nm but only about fifteen percent transmissive at 266 nm. Since eighty percent of the power is absorbed in the glass at 266 nm, starting laser powers may be about six times higher to achieve the same ablation fluence at the release interface. There is accordingly risk of thermal shock in the glass handler itself.

An exemplary 355 nm scanning laser debonding system may include the following: 1) a Q-switched tripled YAG laser with an output power of 5 to 10 Watts at 355 nm, with a repetition rate between 50 and 100 kHz, and pulsewidth of between 10 and 20 ns. The output beam of this laser may be expanded and directed into a commercial 2-axis scanner, comprising mirrors mounted to x and y galvanometer scan motors. The scanner may be mounted a fixed distance above a fixed wafer stage, where the distance would range from 20 cm to 100 cm depending on the working area of the wafer to be released. A distance of 50 to 100 cm may effectively achieve a moving spot speed on the order of 10 meters/second. An F-theta lens may be mounted at the downward facing output of the scanner, and the beam may be focused to spot size on the order of 100 to 500 microns. For a six watt output power laser at 355 nm, at 50 kHz repetition and 12 ns pulsewidth, a scanner to wafer distance of 80 cm operating at a raster speed of 10 m/s, the optimal spot size may be on the order of 200 microns, and the required about 100 mJ/sq. cm ablation fluence may be delivered to the entire wafer surface twice in about thirty seconds (for example, using overlapping rows). The use of overlapping rows where the overlap step distance equals half the spot diameter (e.g., 100 microns) may ensure that no part of the wafer is missed due to gaps between scanned rows and that all parts of the interface see the same total fluence. US 2014/0106473 discloses an exemplary method of effecting full wafer and handler release.

An exemplary approach for performing handler wafer bonding and debonding in accordance with exemplary embodiments includes applying the release layer to the handler while an adhesive layer may be applied to the device wafer. However, according to other exemplary approaches, the release layer may be applied to the handler and then the adhesive layer may be applied to the release layer. The release layer is interposed between the glass handler and the adhesive. Thereafter, the device wafer may be bonded to the handler such that the release layer and the adhesive layer are provided between the device wafer and the handler. The bonding may include a physical bringing together of the device wafer and the handler under controlled heat and pressure in a vacuum environment such as offered in any one of a number of commercial bonding tools. After the device wafer has been successfully bonded to the handler, desired processing may be performed. Laser ablation is employed to allow separation of the device wafer 22 from the original glass handler 28 along the plane of the ablation (release) layer. For pulses in the range of 10-20 nanoseconds, ablation may include photothermal, photomechanical and/or photochemical ablation of the ablation layer. The thinned device wafer 22 is substantially opaque to UV radiation and will accordingly block such radiation during release of the original glass handler 28. The device wafer is then cleaned to remove residual adhesive. The bond between the second glass handler and the device wafer is unaffected. The ablation layers within the two bonding layers may or may not be comprised of the same materials, but are preferably the same. A thin silicon device layer can alternatively be obtained by controlled spalling of the silicon wafer prior to bonding it to a glass handler. Controlled spalling is performed using a flexible handle layer (e.g. Kapton tape) attached (e.g. bonded) to a metal (e.g. nickel) stressor layer to cause a fracture in a substrate along a desired plane. Exemplary controlled spalling techniques are disclosed in US Pub. Nos. 2010/0307572 and 2011/0048517, both of which are incorporated by reference herein. If spalling is employed, the spalled portion of the silicon wafer would be bonded to a glass handler. The flexible handle and metal stressor layers would then be removed to obtain a structure as shown in FIG. 4.

Figure 5:
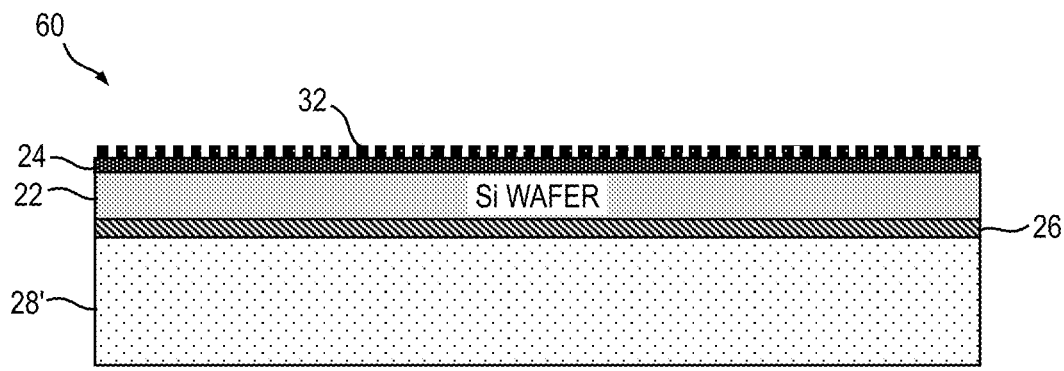
FIG. 5 is a schematic sectional illustration showing the assembly of FIG. 4 following the application and patterning of a photoresist layer on the device side of the silicon wafer.

Referring to FIG. 5, a resist layer 32, typically ranging from two (2) to ten (10) microns in thickness, is applied to the device side of the silicon wafer 22. A reverse tone resist is employed in some embodiments. The resist layer is patterned to obtain the structure 60 as schematically illustrated. The distance between the trenches formed in the resist is approximately the size of the dies to be obtained following singulation. The dies to be obtained in some embodiments are two hundred microns or less on a side and one hundred microns or less in thickness. Dies within such a size range are sometimes referred to as dielets.

Figure 6:
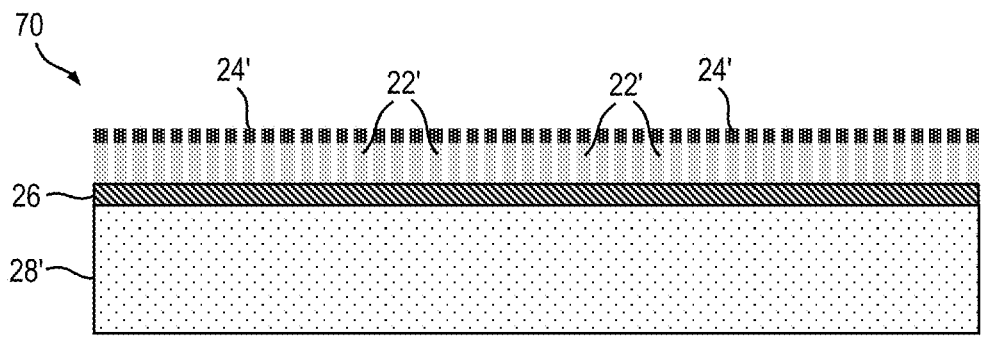
FIG. 6 is a schematic sectional illustration showing the assembly of FIG. 5 following deep reactive ion etching (DRIE) of the silicon wafer.

Deep reactive ion etching (DRIE) is employed to obtain multiple dies 22' from the device wafer 22, each comprising an integrated circuit 24'. Trenches having widths of about ten microns (10 µm) are formed in some embodiments. The highly anisotropic etch etches silicon preferentially and causes the walls of the trenches to be substantially vertical. The trenches extend completely through the silicon device wafer 22. If oxide is on the surface, a different etchant may be employed initially to remove the oxide followed by etching of the silicon. An exemplary resulting structure 70 is schematically illustrated in FIG. 6. The structure comprises the second glass handler 28', an array of dies 22' and associated integrated circuits 24', and a bonding layer 26 that bonds the dies to the handler 28'. Dies having small dimensions can be obtained using the techniques described herein. Die thicknesses in the range between 30-200 μm are obtained in some embodiments, and are preferably 50 μm or less. The dies obtained in some embodiments are 200 μm or less on each side. In an exemplary embodiment, dies are obtained having one side of 200 μm or less and another side of 50 μm or less. In embodiments where the dies contain through silicon vias, the conductor diameter is about five microns in some embodiments. Such vias can be formed of plated copper, CVD-deposited tungsten, or other suitable electrical conductor. The bonding layer can be subjected to UV radiation to release the dies either individually or in groups, as discussed further below.

Figure 7:
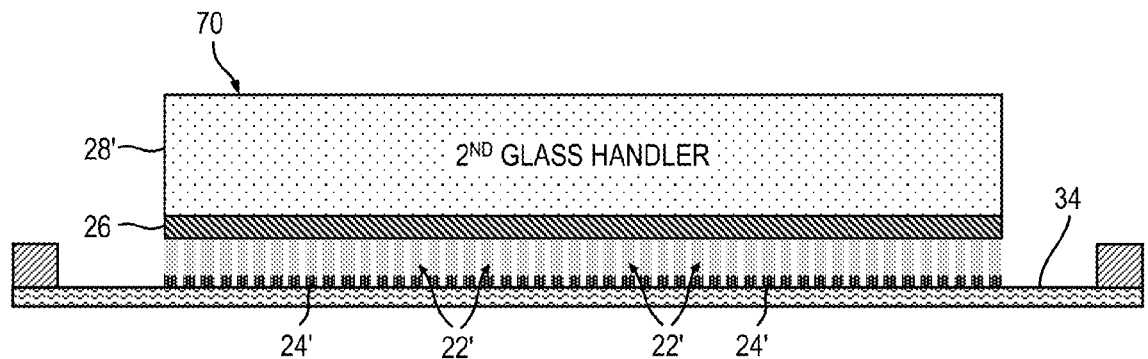
FIG. 7 is a schematic sectional illustration showing the assembly of FIG. 6 mounted to a tape frame.

Device fabrication can be facilitated by releasing selected dies or groups of dies to a tape having an adhesive surface or into a precision die pack. Laser release need not involve scanning the beam uniformly, but rather it is directed to selectively release thin dielets in small groups, as a single row or column, or even as discrete dielets in some embodiments. Referring to FIG. 7, the exemplary structure 70 is mounted to a tape frame 34 such that the dies 22' adjoin the tape. As discussed above, the ablation layer contained within the bonding layer 26 is chosen to be highly absorptive in the ultraviolet spectrum of interest, namely between 308 nm and 355 nm. In some embodiments, about eighty to ninety percent of the laser fluence is absorbed by the ablation layer. Such absorption enables wafer separation as the ablation layer disintegrates. The remainder of the fluence penetrates into the adhesive layer. In some embodiments of the exemplary structure 70, the adhesive layer is also capable of absorbing fluence at the desired wavelengths (308-355 nm). By providing an ablation layer and an adhesive layer that both have absorption properties, only a negligible amount of the starting fluence is allowed to reach the surfaces of the dies that include the integrated circuits 24'. Release of the dies 22' to the tape is facilitated in some embodiments by an optical scanner and a pulsed laser that provide a high speed targeted release of collections of dies 22' or individual dies.

Figure 8:
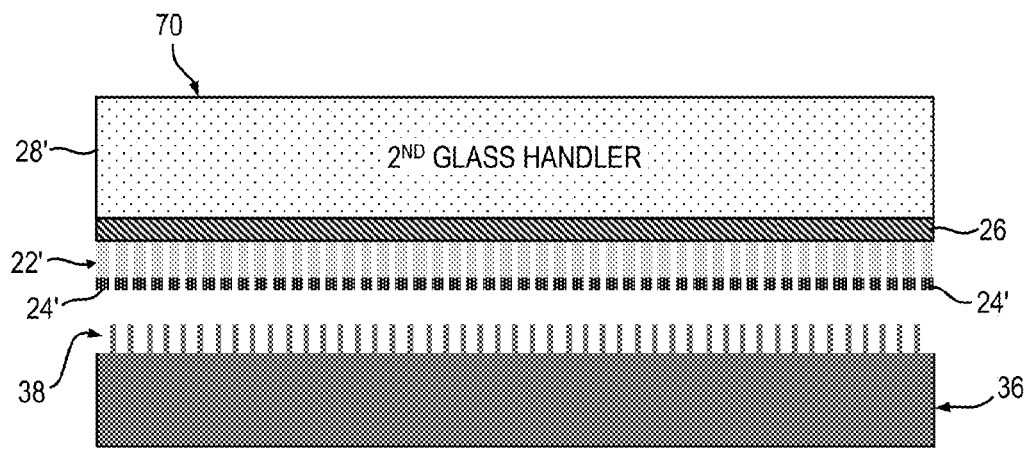
FIG. 8 is a schematic sectional illustration showing the assembly of FIG. 6 aligned with a die pack mold.
Figure 9:
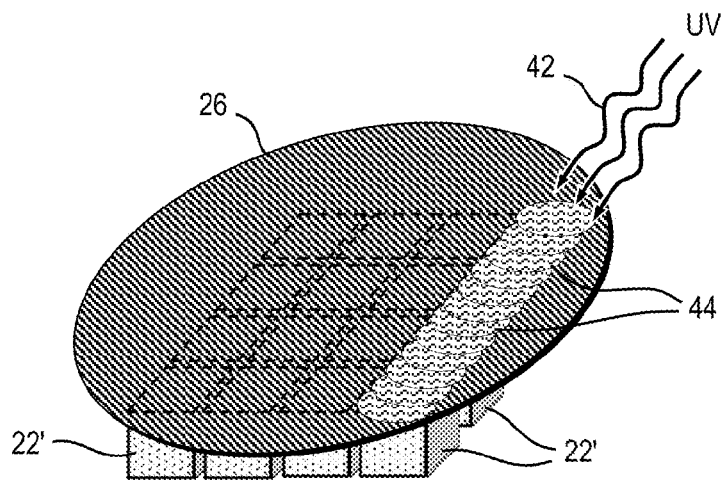
FIG. 9 is a schematic perspective view showing the targeted release of selected dies from a glass handler.

In some embodiments, dielets obtained following singulation have such small dimensions that handling them and picking them from a tape becomes impractical. Rather than releasing the dies 22' to a tape frame, they are alternatively released to a die pack mold 36 in accordance with a further exemplary embodiment, as schematically illustrated in FIG. 8. The die pack mold in one exemplary embodiment includes a silicon wafer that is subjected to patterning and etching (for example, DRIE). The top surface of the wafer includes an array of cavities 38 that have dimensions corresponding to those of the dies 22' to be deposited therein. The cavity widths and lengths are substantially the same as the widths of the dies 22'. Cavity depths are the same or somewhat less than the depths of the dies 22' so that surfaces of the dies remain accessible once deposited in the die cavities. Silicon partitions delineate the cavities. As schematically illustrated in FIG. 9, UV radiation 42 is emitted from a UV source, passes through the handler 28', and penetrates the UV-sensitive bonding layer 26. The spot 44 size of the laser-generated radiation substantially matches the dimensions of the dies in some exemplary embodiments, allowing local release from the second glass handler 28'. The dies 22' are accordingly transferred to either tape or into the cavities formed in a die pack mold. As indicated above, groups of dies are transferred in some embodiments and individual dies are transferred in other embodiments.

Figure 10:
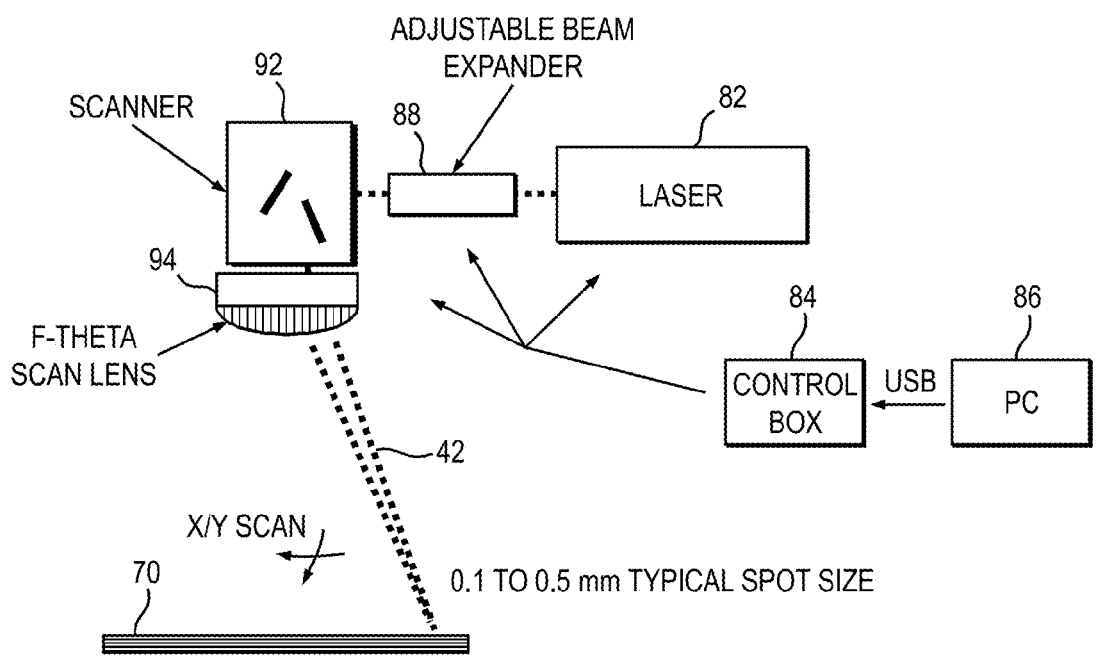
FIG. 10 is a schematic illustration of an assembly for releasing individual dies from a glass handler.

FIG. 10 shows an exemplary system for wafer or die level release. Such a system can accordingly be employed for releasing the glass handler 28 from the device wafer 22, as discussed above with respect to FIG. 4, or dies 22' from the exemplary structure 70 described above with respect to FIG. 6. In one exemplary embodiment, a Q-switched triple YAG laser 82, an adjustable beam expander, and a scanner 92 are operatively associated with a computer 86 and a control box 84. An F-Theta scan lens 94 having an appropriate focal length is operatively associated with the scanner 92.

Penetration depth is a measure of the depth electromagnetic radiation can penetrate into a material, specifically the depth at which the intensity of the radiation falls to 1/e or about 36.8% of its original value at the substrate surface. Penetration depth $\delta_p$ is generally a function of wavelength for a given material. Intensity decreases as a function of thickness measured in penetration depths. For example, while intensity is about 36.8% of the original intensity at one penetration depth, it is only about 13.5% of the original intensity at two penetration depths and about five percent at three penetration depths. Referring again to FIG. 9, UV light 42 is directed to the UV-transmissive handler 28'. In the exemplary embodiment, only about five to fifteen percent of the fluence at the surface of the handler enters the adhesive layer portion of the bonding layer 26, due largely to the absorption by the ablation layer of the bonding layer 26 that adjoins the glass handler 28'. The adhesive layer allows less than about two percent of the original fluence to exit towards the device wafer 22. In the exemplary embodiments, the penetration depth of the ablation layer is between about 0.1-0.2 μm while the penetration depth of the thicker adhesive layer is between two and twenty micrometers. The ablation layer in one or more embodiments is on the order of 0.2-0.3 μm in thickness. This confines the laser pulse energy (about one hundred mJ/cm$^2$ for about ten nanoseconds duration in some embodiments) to a very thin zone adjacent to the handler to achieve complete release at reasonable fluence.

Certain high-temperature polymer adhesives based on polyimide absorb UV radiation in the wavelength range between 350 nm and 300 nm and comprise the adhesive layer in some embodiments. Thus, the amount of residual UV fluence reaching the active wafer surface can vary depending on the thickness uniformity of the original ablation layer and the optical properties and thickness of the adhesive layer below. Coating defects in the ablation layer may lead to yield loss unless there is additional filtering of the UV pulse over the substantially greater thickness of the adhesive layer. The adhesive layer employed, as combined with the ablation layer, have the necessary optical properties to help prevent laser induced damage that could result from an appreciable amount of the ablation pulse reaching the active wafer or die surface where it could interact with materials such as polyimide or PECVD silicon nitride (SiN$_x$) passivation layers.

In accordance with one or more embodiments, a multi-layer debonding structure includes two layers, namely the ablation layer and the adhesive layer, having absorption properties and thicknesses that ensure that no more than a negligible amount of the ablation fluence is allowed to reach the device wafer surface or the die surfaces. By specifying the required UV absorption requirements of both the ablation layer and the underlying adhesive, debonding can be safely conducted without a substantial risk of causing laser induced damage. In exemplary embodiments, the ablation layer has a thickness of at least two penetration depths, and preferably between two and four penetration depths. The adhesive layer has a thickness of at least one penetration depth and preferably between one and two penetration depths. The penetration depth of the ablation layer is between 0.1 and 0.2 microns in one or more embodiments while the penetration depth of the adhesive layer is between two and twenty microns in one or more embodiments.

In some embodiments, the adhesive layer has intrinsic optical absorption properties in the desired range of wavelengths. An exemplary commercial adhesive which readily absorbs UV laser radiation in the wavelength range from 300 nm to 360 nm would be the polyimide-based product by HD Microsystems called HD-3007 Adhesive. This commercial adhesive is a non-photodefinable polyimide precursor designed for use as a temporary or permanent adhesive in 3D packaging applications. It exhibits thermoplastic behavior after cure and during bonding at moderate temperature and pressure. Thermoplastic adhesives having base materials that do not have intrinsic optical absorption at the laser wavelength(s) desired, or have insufficient optical absorption properties, are modified in some embodiments by the addition of fine nanoparticles. Suspensions of the nanoparticles can be added in amounts which, when uniformly dispersed throughout the adhesive, lead to the approximation of a neutral density filter which scatters a known percentage of the incoming laser pulse with little dependence on wavelength. Exemplary nanoparticles include aluminum and alumina nanoparticles. In other exemplary embodiments, dyes are added to thermoplastic adhesives that do not exhibit the desired absorption properties. Some dyes are known to absorb in the laser wavelengths employed in one or more embodiments. As disclosed, for example, in U.S. Pat. No. 5,169,678, which is incorporated by reference herein, various dyes can be added to polymeric materials to affect the absorbance thereof. In some examples, the polymer is melted and the dye is added to the polymer melt. In other examples, the dye is diffused or dissolved into the polymer using a solvent. Even distribution of the dye is obtained in some embodiments. Dyes such as p-phenylazophenol, N-p methoxybenzylidene-p-phenylazoaniline, dihydroxyanthraquinone and beta carotine are among those that may be employed to provide absorbance in the UV range. Such dyes may be used as formulated in some embodiments or with substitutions to adjust the absorbance frequencies. Exciton products such as "DPS" (CAS 2039-68-1) and "Bis MSB" (CAS 13280-61-0) are other exemplary materials that can be employed within polymers to provide absorbance in the UV range in one or more embodiments. Further exemplary dyes that can be employed in one or more embodiments include 9-anthracenecarboxylic acid and benzanthrone.

An exemplary coating process for either the thin ablation layer or the HD-3007 adhesive includes dispensing of a few ml of the material, spin applying at between 1000 and 3000 rpm for sixty seconds, baking at about 110° C. to drive off the solvent, and curing on a hotplate or in a nitrogen oven at about 350° C. for ten minutes. A specific bonding recipe for HD-3007 adhesive includes aligning the adhesive-coated wafer to the handler, holding them apart by a small distance using spacers, and introducing the wafer pair into a chamber where vacuum would be pulled, such that the space between them is fully evacuated. The temperature would ramp up to above 100° C. to help de-gas the adhesive, and the spacers would be removed to place the wafer and handler in contact. Heating plates above and below would ramp up to a final bonding temperature of between 300° C. and 350° C., and a pressure of about 8000 mbar would be applied to the pair for five minutes to effect bonding. The pair would be held under pressure as the plates ramped back down to below the glass transition temperature Tg.

The tailored release layer comprising part of the bonding layer 26 can be fully ablated to release the device wafer 22 from the original glass handler 28 or, as shown in FIG. 9, the singulated dies 22' from the second glass handler 28'. The laser 82 in one or more embodiments operates at 355 nm and provides 12 nsec pulses at 50 kHz. A large separation distance between the laser and substrate allows for the relatively quick scanning of an entire wafer. Smaller separation distances facilitate the precision releases of individual dies. A release fluence of about 100 mJ/cm$^2$ in a 100 µm diameter spot requires about 1.5 Watts. A typical spot size is between 0.1-0.5 mm.

Figure 11:
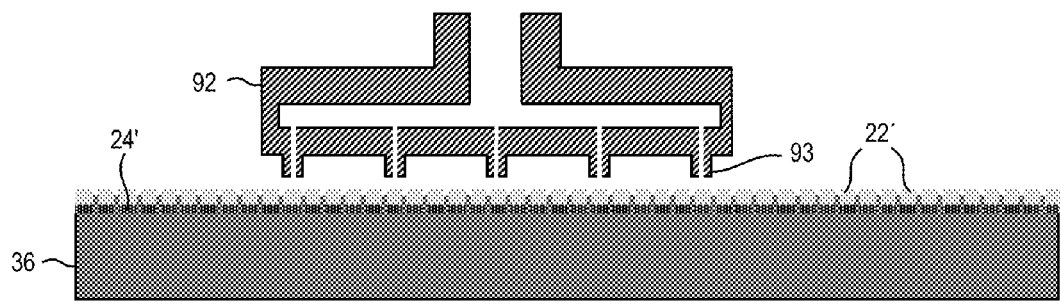
FIG. 11 is a schematic illustration showing an assembly aligned with a die pack containing individual dies.
Figure 12:
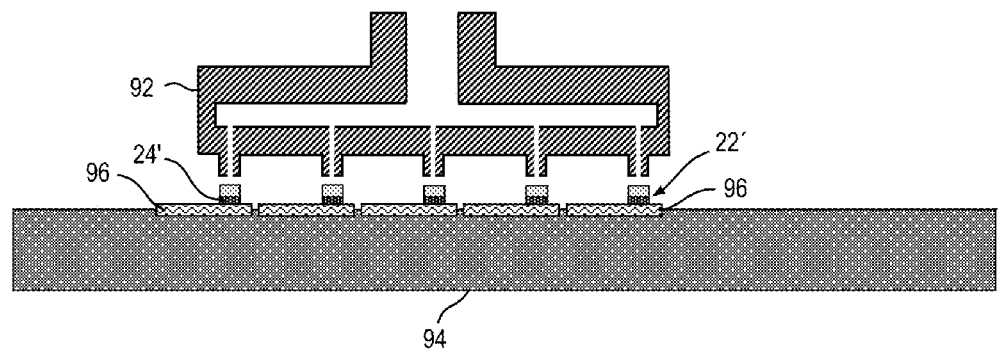
FIG. 12 is a schematic illustration showing the assembly of FIG. 11 depositing selected individual dies on packages mounted to a substrate.

FIGS. 11 and 12 illustrate further steps in an exemplary fabrication process once dies 22' have been transferred to cavities 38 within a silicon die pack 36 as discussed above with respect to FIG. 8. Such steps provide a practical solution for selectively picking dielets having very small dimensions and placing them onto electronic packages such as RFID flex packages for bonding as discussed further below. A precision etched silicon bonding head 92 picks up every nth die according to the needs of the fabrication process. The head 92 includes nozzles 93 having outer diameters that substantially equal the widths of the dies 22'. The nozzles apply suction forces to the dies 22' to allow the dies to be removed from the cavities 38 as the head 92 is raised. The dies 22' are transferred to packages 96 by the head 92 as shown in FIG. 12 and the suction pressure is discontinued. The dies are bonded to packages 96. Features of the head 92, such as the nozzles and internal nozzle passages that provide suction, are obtained by DRIE in one or more embodiments.

Figure 13A:
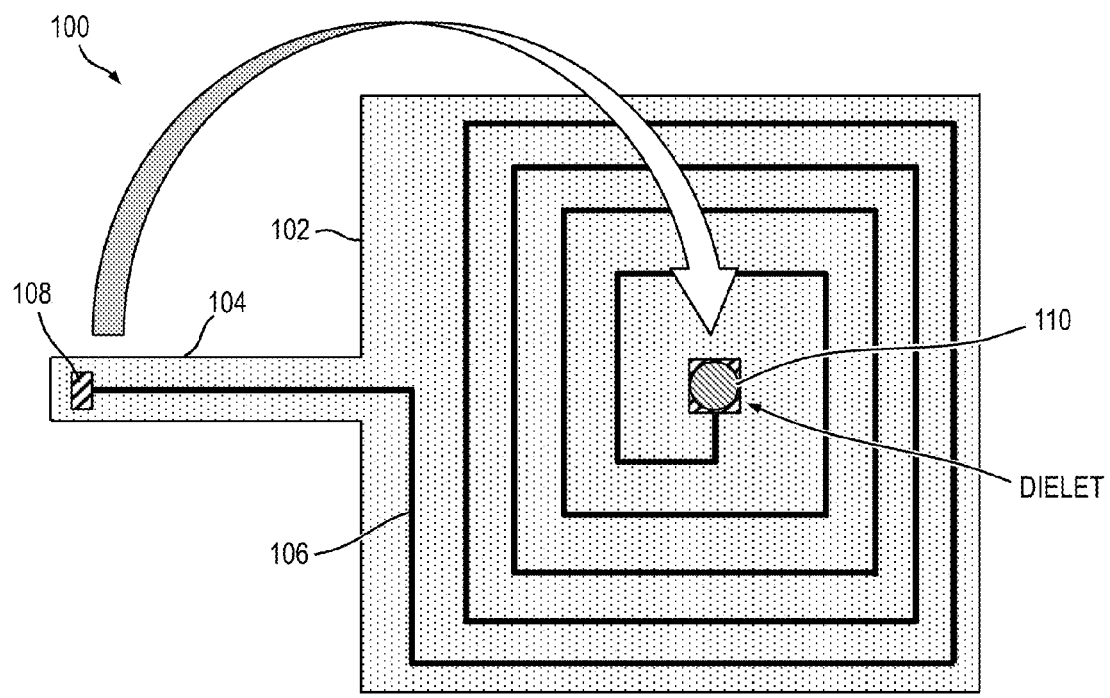
FIGS. 13A and 13B show schematic top and side views of a device including a dielet on a flexible substrate.
Figure 13B:
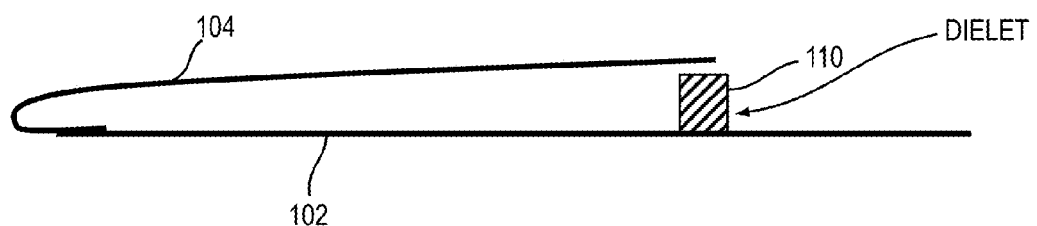

FIGS. 13A and 13B show a RFID device 100 including a flexible substrate 102 having an integral tab 104 extending therefrom. An antenna 106 is electrically connected to a RFID chip 110 at or near the center of the main body portion of the flexible substrate in some embodiments. The width of the main body portion is greater than the width of the integral tab, as shown in FIG. 13A. In one or more embodiments, the width of the main body portion is at least twice the width of the tab and may be as much as twenty times greater than the width of the tab 104. The antenna is formed through metallization of the flexible substrate, including the tab, to provide a generally spiral configuration having one end near the center of the flexible substrate and another end terminating at an electrically conductive contact 108 near the outer end of the tab 104. The antenna occupies the majority of the area that forms the main body portion of the substrate 102. In some embodiments, the antenna consists essentially of copper. Once the metallization process is complete and the antenna and contact 108 have been formed, the RFID chip 110 is deposited on the flexible substrate. The fabrication processes described above with respect to FIGS. 1-12 may be employed to fabricate the RFID chip and transfer it to the flexible substrate. In other words, the dies 22' are RFID chips in one or more embodiments and the packages 96 (FIG. 12) comprise the flexible substrates 102 having antennas integral therewith. The tab 104 has a substantially smaller width than that of the main body of the flexible substrate. The length of the tab is sufficient to allow the tab to overlap the portion of the main body of the flexible substrate that includes the RFID chip 110. The contact 108 can accordingly engage the top surface of the chip 110 when the tab is folded, as shown in FIG. 13B. In one or more embodiments, the tab 104 has a width between ten microns and two millimeters and a length between one hundred microns and four millimeters. Because the chip 110 can be electrically connected to an external inductor via a tiny flexible loop formed by the tab 104, a very small package is obtainable. A through silicon via (TSV) that completes the chip-inductor loop further helps reduce package size. The flexible substrate comprises electrically insulating materials such as Kapton, polyethylene terephthalate (PET), or thin glass in some embodiments. The listed materials should be considered exemplary and not limiting.

Given the discussion thus far and with reference to the exemplary embodiments discussed above and the drawings, it will be appreciated that, in general terms, an exemplary fabrication method includes obtaining a structure comprising a device wafer. The device wafer 22 includes a device side 24 including a plurality of integrated circuits. The structure further includes a UV-transmissive handler 28' and a bonding layer 26 that bonds the handler to the device wafer. An exemplary structure 50 is schematically illustrated in FIG. 4. The exemplary fabrication method further includes applying a resist layer 32 to the device side of the device wafer, patterning the resist layer, and singulating the device wafer using deep reactive ion etching, thereby forming a plurality of dies 22' separated by trenches extending completely through the device wafer. The patterned resist layer is removed to obtain a structure 70 as schematically illustrated in FIG. 6. A die pack 36 including a plurality of die cavities 38 is provided and the singulated dies are aligned with the dies cavities. At least part of the bonding layer 26 is subjected to UV radiation through the UV-transmissive handler. Fluence of selected energy is released in a spot 44 within the bonding layer 26, the spot having dimensions corresponding to the dimensions of the dies, thereby causing release of an individual one of the dies 22' from the UV-transmissive handler into one of the die cavities 38. In some embodiments, the method further includes releasing fluence of the selected energy in a plurality of spots having dimensions corresponding to dimensions of the dies, thereby causing release of a plurality of individual ones of the dies from the UV-transmissive handler into individual ones of the die cavities. The method may further include simultaneously picking individual ones of the dies 22' from the die cavities and placing the individual ones of the dies picked from the cavities in parallel onto flexible substrates 102 including integral antennas 106. On one or more embodiments, each of the dies has a thickness of less than 200 µm and a width of less than 200 µm. In some embodiments, the dies 22' are fifty microns or less in thickness.

A second exemplary method includes obtaining a structure including a device wafer 22 including a device side 24 comprising a plurality of integrated circuits, a UV-transmissive handler 28', and a bonding layer 26 that bonds the UV-transmissive handler to the device wafer, the device wafer having a thickness of 200 µm or less. A resist layer 32 is applied to the device side of the device wafer and is patterned. The method further includes singulating the device wafer using deep reactive ion etching, thereby forming a plurality of dies 22' separated by trenches extending completely through the device wafer. The patterned resist layer is removed and a die pack 36 including a plurality of die cavities 38 is provided. Each of the die cavities 38 is configured for accepting an individual one of the dies 22'. The dies are aligned with the die cavities and at least part of the bonding layer 26 is subjected to UV radiation through the UV-transmissive handler 28', thereby causing selective release of one or more of the dies 22' from the UV-transmissive handler into one or more of the cavities 38 within the die pack 36. In some embodiments, the exemplary method further includes simultaneously picking individual ones of the dies from the die cavities, as shown in FIG. 11, and placing the individual ones of the dies picked from the die cavities in parallel onto flexible substrates including integral antennas, such as shown in FIG. 12. The step of subjecting at least part of the bonding layer to UV radiation 42 further includes, in some embodiments, releasing fluence of selected energy in a plurality of spots 44, each spot having dimensions corresponding to dimensions of the dies, thereby causing release of a plurality of individual ones of the dies from the UV-transmissive handler into individual ones of the die cavities. The die pack is obtained in one or more embodiments by obtaining a silicon substrate, etching the silicon substrate to form the plurality of die cavities 38 within the silicon substrate, each cavity having width and length dimensions substantially matching width and length dimensions of the plurality of dies, each of the width and length dimensions being 200 µm or less.

An exemplary RFID device 100 includes a flexible, electrically insulating substrate 102 having a thickness between 25-100 µm, the substrate including a main portion and an integral tab 104 extending from the main portion. The tab is foldable with respect to the main portion of the substrate. An antenna 106 is integral with the main portion of the substrate. An electrical contact is integral with the tab and is electrically connected to the antenna. A RFID die including an integrated circuit is mounted to the main portion of the substrate and electrically connected to the antenna. The die has a thickness of 200 µm or less and a width of 200 µm or less. The electrical contact is positioned to contact a top surface of the die when the tab is folded with respect to the main portion of the substrate.

Those skilled in the art will appreciate that the exemplary structures discussed above can be distributed in raw form or incorporated as parts of intermediate products or end products such as RFID devices.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation. It should also be noted that, in some alternative implementations, the steps of the exemplary methods may occur out of the order noted in the figures. For example, two steps shown in succession may, in fact, be executed substantially concurrently, or certain steps may sometimes be executed in the reverse order, depending upon the functionality involved.

The corresponding structures, materials, acts, and equivalents of all means or step plus function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

What is claimed is:

1. A method comprising:
obtaining a structure comprising a device wafer including a device side comprising a plurality of integrated circuits, a UV-transmissive handler, and a bonding layer that bonds the UV-transmissive handler to the device wafer;
applying a resist layer to the device side of the device wafer;
patterning the resist layer;
singulating the device wafer using deep reactive ion etching, thereby forming a plurality of dies separated by trenches extending completely through the device wafer;
removing the patterned resist layer;
providing a die pack including a plurality of die cavities and aligning the dies with the die cavities;
subjecting at least part of the bonding layer to UV radiation through the UV-transmissive handler, thereby releasing fluence of selected energy in a spot within the bonding layer, the spot having dimensions corresponding to dimensions of the dies, thereby causing release of an individual one of the dies from the UV-transmissive handler into one of the die cavities.

2. The method of claim 1, further including releasing fluence of the selected energy in a plurality of spots within the bonding layer, the spots having dimensions corresponding to dimensions of the dies, thereby causing selected release of a plurality of individual ones of the dies from the UV-transmissive handler into selected ones of the die cavities.

3. The method of claim 2, further including simultaneously picking individual ones of the dies from the die cavities and placing the individual ones of the dies picked from the cavities in parallel onto flexible substrates including integral antennas.

4. The method of claim 3, wherein the step of simultaneously picking individual ones of the dies from the die cavities further includes contacting the individual ones of the dies with nozzles and applying suction through the nozzles.

5. The method of claim 3, wherein each flexible substrate includes a main body portion and a tab integral with the main body portion, the tab including a contact electrically connected to the antenna, the tab being foldable with respect to the main body such that the contact is engageable with the individual one of the dies placed on the flexible substrate.

6. The method of claim 5, wherein each of the dies has a thickness of less than 200 μm and a width of less than 200 μm, further including the step of folding the tab with respect to the main body portion of the flexible substrate to cause the contact to form an electrical connection with the individual one of the dies placed on the flexible substrate.

7. The method of claim 1, wherein each of the dies has a thickness of fifty microns or less.

8. The method of claim 1, wherein the step of obtaining the structure comprises:
obtaining a silicon wafer comprising the plurality of integrated circuits;
bonding the silicon wafer to a glass handler;
grinding the silicon wafer to reduce the thickness thereof, thereby forming the device wafer;
joining the UV-transmissive handler to the device wafer such that the bonding layer is between the UV-transmissive handler and the device wafer, and
removing the glass handler.

9. The method of claim 8, wherein the step of removing the glass handler further includes causing UV radiation to pass through the glass handler in the direction of the device wafer.

10. A method comprising:
obtaining a structure including a device wafer including a device side comprising a plurality of integrated circuits, a UV-transmissive handler, and a bonding layer that bonds the UV-transmissive handler to the device wafer, the device wafer having a thickness of 200 μm or less;
applying a resist layer to the device side of the device wafer;
patterning the resist layer;
singulating the device wafer using deep reactive ion etching, thereby forming a plurality of dies separated by trenches extending completely through the device wafer;
removing the patterned resist layer;
providing a die pack including a plurality of die cavities, each of the die cavities configured for accepting an individual one of the dies;
aligning the dies with the die cavities within the die pack;
subjecting at least part of the bonding layer to UV radiation through the UV-transmissive handler, thereby causing selective release of one or more of the dies from the UV-transmissive handler into one or more of the cavities within the die pack.

11. The method of claim 10, further comprising:
simultaneously picking individual ones of the dies from the die cavities, and
placing the individual ones of the dies picked from the die cavities in parallel onto flexible substrates including integral antennas.

12. The method of claim 11, wherein each flexible substrate includes a main body portion and a tab integral with the main body portion, the tab including a contact electrically connected to the antenna, the tab being foldable with respect to the main body such that the contact is engageable with the die placed on the flexible substrate.

13. The method of claim 12, wherein the die placed on the flexible substrate has a thickness of less than 200 μm and a width of less than 200 μm, further including the step of folding the tab with respect to the main body portion of the flexible substrate to cause the contact to form an electrical connection with the die placed on the flexible substrate.

14. The method of claim 10, wherein the step of subjecting at least part of the bonding layer to UV radiation further includes releasing fluence of selected energy in a plurality of spots, each spot having dimensions corresponding to dimensions of the dies, thereby causing release of a plurality of individual ones of the dies from the UV-transmissive handler into individual ones of the die cavities.

15. The method of claim 10, further including the steps of:
obtaining a silicon substrate;
etching the silicon substrate to form the plurality of die cavities within the silicon substrate, each cavity having width and length dimensions substantially matching width and length dimensions of the plurality of dies, each of the width and length dimensions being 200 μm or less.

16. The method of claim 10, wherein the step of subjecting at least part of the bonding layer to UV radiation through the UV-transmissive handler further includes releasing fluence of selected energy in a spot within the bonding layer, the spot having a selected diameter and causing release of an individual one of the dies.

* * * * *